(12) United States Patent
Nakaya et al.

(10) Patent No.: US 10,651,044 B2
(45) Date of Patent: May 12, 2020

(54) PROCESSING METHOD AND PLASMA PROCESSING APPARATUS

(71) Applicant: Tokyo Electron Limited, Tokyo (JP)

(72) Inventors: Michiko Nakaya, Miyagi (JP); Masanobu Honda, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/903,437

(22) Filed: Feb. 23, 2018

(65) Prior Publication Data
US 2018/0247826 A1 Aug. 30, 2018

(30) Foreign Application Priority Data
Feb. 28, 2017 (JP) ................................. 2017-036892

(51) Int. Cl.
*H01L 21/3065* (2006.01)
*H01J 37/32* (2006.01)
*H01L 21/768* (2006.01)
*H01L 21/311* (2006.01)
*H01L 21/02* (2006.01)

(52) U.S. Cl.
CPC ........ *H01L 21/30655* (2013.01); *H01J 37/32* (2013.01); *H01L 21/0212* (2013.01); *H01L 21/02274* (2013.01); *H01L 21/31116* (2013.01); *H01L 21/31144* (2013.01); *H01L 21/7682* (2013.01); *H01J 2237/3327* (2013.01); *H01J 2237/3347* (2013.01)

(58) Field of Classification Search
CPC .......... H01L 21/0212; H01L 21/30655; H01L 21/7682; H01J 2237/3347; H01J 2237/3327
USPC ......................... 438/696, 710, 714, 717, 736
See application file for complete search history.

(56) References Cited

U.S. PATENT DOCUMENTS

2012/0214313 A1* 8/2012 Ooya ................ H01J 37/32091
  438/712
2016/0181117 A1* 6/2016 Arghavani ........ H01L 21/31116
  438/712

FOREIGN PATENT DOCUMENTS

| JP | 2006-514783 | 5/2006 |
|----|-------------|--------|
| JP | 2013-219099 | 10/2013 |
| JP | 2015-530742 | 10/2015 |
| WO | 2004/034445 | 4/2004 |
| WO | 2014/025507 | 2/2014 |

* cited by examiner

*Primary Examiner* — Binh X Tran
(74) *Attorney, Agent, or Firm* — IPUSA, PLLC

(57) ABSTRACT

A processing method including a first step of supplying a first gas including a carbon-containing gas and an inert gas into an inside of a chamber and a second step of generating plasma from the supplied first gas by applying high frequency power for generating plasma and causing a chemical compound including organic matter on a pattern of a predetermined film formed on an object to be processed, wherein a ratio of the carbon-containing gas relative to the inert gas included in the first gas is 1% or less.

9 Claims, 16 Drawing Sheets

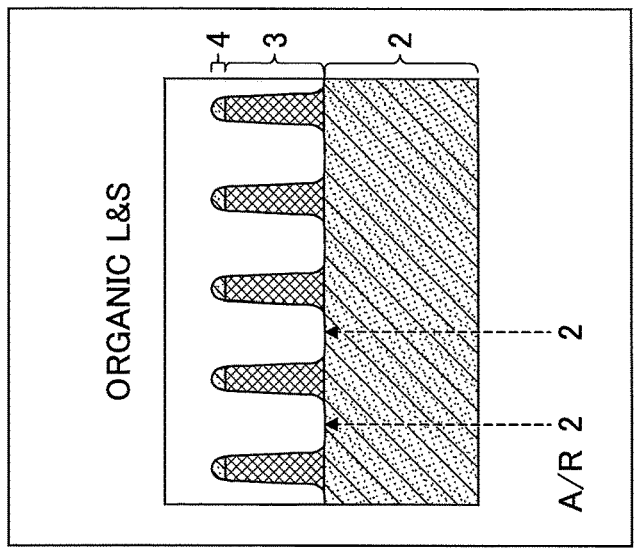
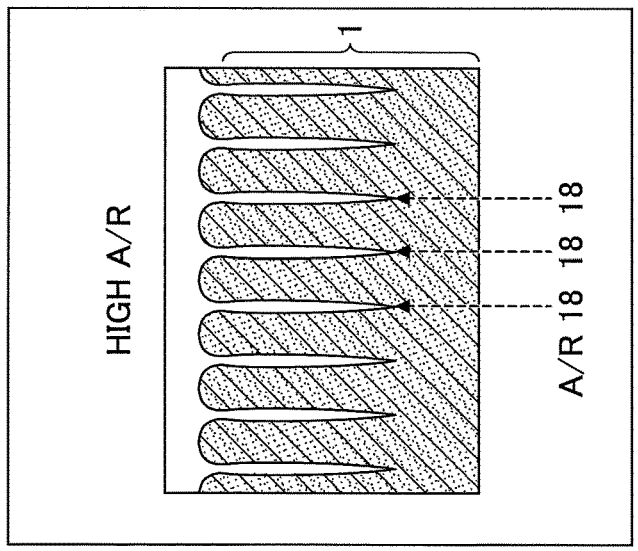
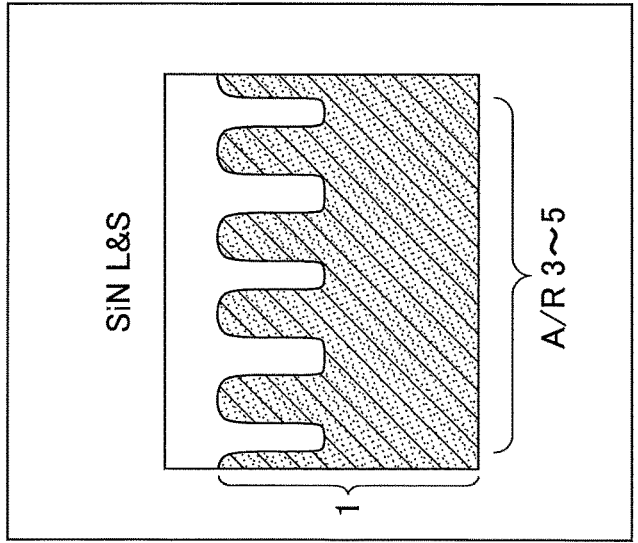

| SAMPLE | CONDITIONS | DILUTION DEGREE 0.4% | DILUTION DEGREE 0.6% | DILUTION DEGREE 1% |
|---|---|---|---|---|
| SiN L&S | ΔV ΔH MaxCD MaxCD/ΔV | 77 nm 2.45 nm 61.7 nm 0.801 | 87 nm 3.22 nm 63.3 nm 0.727 | 59 nm 0.352 nm 57.5 nm 0.975 |
| HIGH A/R | ΔV ΔH MaxCD MaxCD/ΔV | 91 nm 0.433 nm 64.2 nm 0.705 | 95 nm 2.1 nm 67.5 nm 0.711 | 68 nm −1.25 nm 60.8 nm 0.895 |
| ORGANIC L&S | ΔV ΔH MaxCD MaxCD/ΔV | 76 nm 13.8 nm 60.0 nm 0.789 | 76 nm 14.8 nm 62.0 nm 0.815 | 58 nm 11.9 nm 56.2 nm 0.969 |

| CONDITIONS SAMPLE | DILUTION DEGREE 1% | DILUTION DEGREE 10% | DILUTION DEGREE 50% |
|---|---|---|---|
| SiN L&S | ΔV 59 nm<br>ΔH 0.352 nm<br>MaxCD 57.5 nm<br>MaxCD/ΔV 0.975 | ΔV —<br>ΔH ∞<br>MaxCD ∞<br>MaxCD/ΔV ∞ | ΔV —<br>ΔH ∞<br>MaxCD ∞<br>MaxCD/ΔV ∞ |

FIG.9

| SAMPLE | CONDITIONS | DILUTION DEGREE 1% 10 mT | DILUTION DEGREE 1% 100 mT | DILUTION DEGREE 0.4% 100 mT | DILUTION DEGREE 0.4% 500 mT |
|---|---|---|---|---|---|
| ORGANIC L&S | | ΔV 62 nm<br>ΔH 21.3 nm<br>MaxCD 74.9 nm<br>MaxCD/ΔV 1.21 | ΔV 58 nm<br>ΔH 11.9 nm<br>MaxCD 56.2 nm<br>MaxCD/ΔV 0.969 | ΔV 76 nm<br>ΔH 13.8 nm<br>MaxCD 60.0 nm<br>MaxCD/ΔV 0.789 | ΔV 105 nm<br>ΔH 18.6 nm<br>MaxCD 69.5 nm<br>MaxCD/ΔV 0.662 |

FIG.12

| CONDITIONS TEMPERATURE | DILUTION DEGREE 0.4% | DILUTION DEGREE 0.6% | DILUTION DEGREE 1% | DILUTION DEGREE 10% | DILUTION DEGREE 50% | DILUTION DEGREE 100% |
|---|---|---|---|---|---|---|
| SiN L&S −50 °C | | | | | — | — |
| ΔV<br>ΔH<br>MaxCD<br>MaxCD/ΔV | 77 nm<br>2.45 nm<br>61.7 nm<br>0.801 | 87 nm<br>3.22 nm<br>63.3 nm<br>0.727 | 59 nm<br>0.352 nm<br>57.5 nm<br>0.975 | 10 nm<br>3.7 nm<br>64.2 nm<br>6.42 | | |
| SiN L&S 20 °C | | | | | | |
| ΔV<br>ΔH<br>MaxCD<br>MaxCD/ΔV | | | 55 nm<br>−5.92 nm<br>45.0 nm<br>0.818 | 13 nm<br>4.7 nm<br>66.2 nm<br>5.09 | 7 nm<br>2.8 nm<br>62.4 nm<br>8.91 | 15 nm<br>5.55 nm<br>67.9 nm<br>4.53 |

PROCESSING METHOD AND PLASMA PROCESSING APPARATUS

CROSS-REFERENCE TO RELATED APPLICATIONS

This patent application is based upon and claims the benefit of priority of Japanese Patent Application No. 2017-036892 filed on Feb. 28, 2017, the entire contents of which are incorporated herein by reference.

BACKGROUND OF THE INVENTION

1. Field of the Invention

The present invention generally relates to a processing method and a plasma processing apparatus.

2. Description of the Related Art

In recent years, dimensions of semiconductor devices have become minute, and an aspect ratio (A/R) of a hole or a groove in a line and space (L/S) is increasing. In etching that forms a recess part having a high aspect ratio (A/R), it is proposed to vertically form, under a mask, a film to be etched (as described in Patent Documents 1-3, for example).

[Patent Document 1] Japanese Translation of PCT International Application Publication No. 2006-514783

[Patent Document 2] Japanese Translation of PCT International Application Publication No. 2015-530742

[Patent Document 3] Japanese Laid-open Patent Application Publication No. 2013-219099

SUMMARY OF THE INVENTION

However, it is preferred to enhance a selection ratio of a mask in the above etching.

Therefore, a step of depositing an organic film on an upper portion of a mask is conducted during an etching step. However, at this time, there may be a case where the organic film is deposited at around an opening in the mask depending on distribution of ions and radicals in plasma. Then, this opening may be blocked by the deposited organic film to prevent etching.

According to an aspect of the present invention, the organic film is anisotropically deposited on the upper portion of the pattern of the recess part formed in the object to be etched.

A processing method includes a first step of supplying a first gas including a carbon-containing gas and an inert gas into an inside of a chamber and a second step of generating plasma from the supplied first gas by applying high frequency power for generating plasma and causing a chemical compound including organic matter on a pattern of a predetermined film formed on an object to be processed, wherein a ratio of the carbon-containing gas relative to the inert gas included in the first gas is 1% or less.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIGS. 3A-3C illustrate examples of samples of an object to be processed according to the embodiment of present invention;

FIG. 5 illustrates examples of test results of gas dilution in a deposition step according to the embodiment of the present invention;

FIG. 7 illustrates examples of test results of gas dilution in the deposition step according to the embodiment of the present invention;

FIG. 9 illustrates examples of test results of pressure dependence in the deposition step according to the embodiment of the present invention;

FIG. 12 illustrates examples of test results of dilution degree in the deposition step according to the embodiment of the present invention;

DETAILED DESCRIPTION OF EMBODIMENTS

A description of embodiments of the present invention is given below, with reference to the FIG. 1 through FIG. 16. The embodiments described below are only examples and the present invention is not limited to the embodiments.

Through all figures illustrating the embodiments, the same references symbols are used for portions having the same function, and repetitive explanations of these portions are omitted.

Reference Symbols Typically Designate as Follows:

1: SiN film;
2: $SiO_2$ film;
3: organic film;
4: Si-ARC;
5: inductively-coupled plasma processing apparatus;
10: chamber;
12: stage;
20: baffle plate;
26: evacuation device;
30: second high frequency power source;

36: electrostatic chuck;
40: direct power source;
44: refrigerant flow path;
52: dielectric window;
54: RF antenna;
56: first high frequency power source;
64: sidewall gas discharge port;
66: gas supply source;
74: control unit; and
R: organic film.

[Plasma Processing Apparatus]

Figure 1:
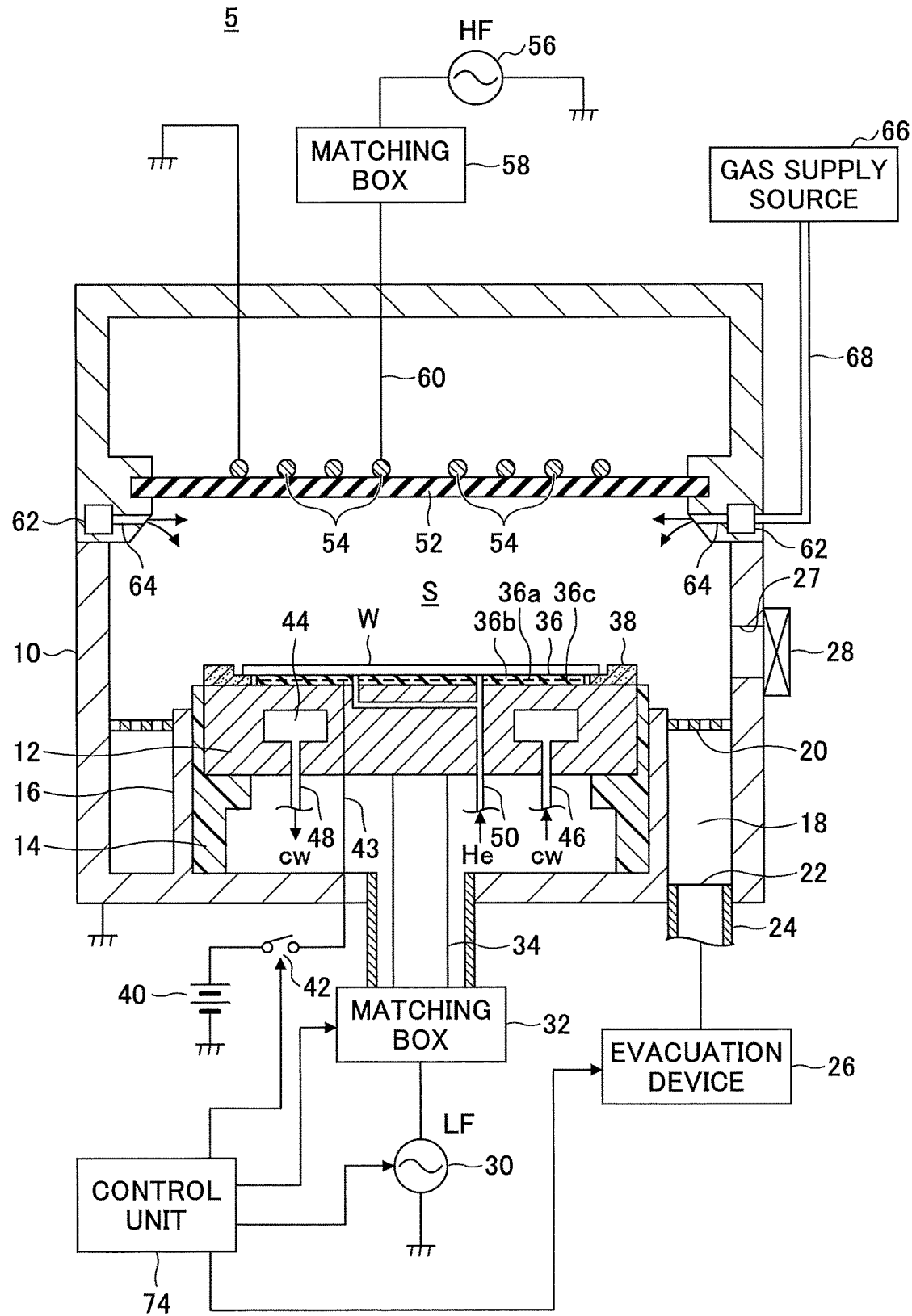
FIG. 1 illustrates an example of a plasma process apparatus according to an embodiment of the present invention.

At first, referring to FIG. 1, an example of the structure of a plasma processing apparatus of an embodiment of the present invention is described. FIG. 1 illustrates an example of the structure of the plasma processing apparatus of this embodiment. Within this embodiment, an inductively-coupled plasma (ICP) processing apparatus 5 is exemplified as a plasma processing apparatus.

This inductively-coupled plasma processing apparatus 5 is formed as a plasma processing apparatus using an RF antenna having a planar coil shape and includes a cylindrical vacuum chamber (hereinafter, referred to as a "chamber") 10 made of a metal such as aluminum and stainless steel. The chamber 10 is electrically grounded.

For example, a disk-like stage 12 mounting a semiconductor wafer (hereinafter, referred to as a "wafer W") is horizontally arranged as a substrate holding seat, which also works as a high frequency electrode, in a lower middle inside the chamber 10. This stage 12 is made of, for example, aluminum and supported by an insulative cylindrical supporting portion 14, which vertically extends from the bottom of the chamber 10.

An annular evacuation path 18 is formed between a conductive cylindrical supporting portion 16 extending in a vertical upward direction from the bottom of the chamber 10 along the outer periphery of the insulative cylindrical supporting portion 14. A baffle plate 20 in an annular shape is attached to an upper portion or an inlet of the annular evacuation path 18. An evacuation port 22 is provided in a bottom part. It is preferable to provide a plurality of evacuation ports 22 at equal intervals in the peripheral direction of the stage 12 to make gas flow inside the chamber 10 uniform for the wafer W on the stage 12 relative to an axis of the stage 12.

The evacuation device 26 is connected to the evacuation ports 22 via the evacuation tubes 24. The evacuation device 26 includes a vacuum pump such as a turbo-molecular pump so as to depressurize the plasma processing space in the chamber 10 to be a desired degree of vacuum. A gate valve 28 for opening and closing a transfer port 27 for carrying in and out the wafer W is provided outside a sidewall of the chamber 10.

A second high frequency power source 30 is electrically connected to the stage 12 through a matching box 32 and a feed rod 34. This second high frequency power source 30 is provided to output variable power (for example, 40 W to 2000 W) of the high frequency power LF for pulling in a bias of a constant frequency (for example, 400 kHz) suitable for controlling the energy of ions pulling into the wafer W. The matching box 32 accommodates a matching circuit of a variable reactance for matching between an impedance on a side of the second high frequency power source 30 and an impedance on a side of a load (mainly, the stage, plasma, and the chamber). A blocking capacitor for generating an auto-bias is included in this matching circuit.

An electrostatic chuck 36 for holding the wafer W is provided on the upper surface of the stage 12. A focus ring 38 annularly surrounding the periphery of the wafer W is disposed on an outer peripheral side of the electrostatic chuck 36. The electrostatic chuck 36 has a structure, in which an electrode 36a made of a conductive film is sandwiched between a pair of insulating films 36b and 36c. A high voltage direct power source 40 is electrically connected to the electrode 36a through a switch 42 and a coated wire 43. The wafer W can be absorbed and held on the electrostatic chuck 36 by electrostatic force caused by a direct current supplied from the direct power source 40.

A refrigerant room or a refrigerant flow path 44 is formed inside the stage 12. The refrigerant room and the refrigerant flow path 44 are in an annular shape extending in a circumferential direction of the stage 12. A refrigerant having a predetermined temperature such as a cooling water cw is circulated into and out of a chiller unit, and is supplied to pipes 46 and 48 from the chiller unit. It is possible to control the temperature of the wafer W on the electrostatic chuck 36 while the wafer W is processed depending on the temperature of the refrigerant. Related to this, a heat transfer gas from a heat transfer gas supplying unit such as a He gas is supplied in between the upper surface of the electrostatic chuck 36 and the back surface of the wafer W through the gas supply pipe 50. Further, a lift pin vertically penetrating through the stage 12 and movable up and down to load and unload the wafer W, a lifting mechanism for activating the lift pin, and so on are disposed.

Next, the structure of various parts related to plasma generation in the inductively-coupled plasma processing apparatus 5 is described. A circular dielectric window 52 made of, for example, a quartz plate is hermetically attached to the ceiling of the chamber 10 with a relatively large distance from the stage 12. The chamber 10 or the stage 12 and a coil-like RF antenna 54 are horizontally and concentrically arranged on the dielectric window 52. This RF antenna 54 is preferably shaped like a spiral coil or a concentric coil having a constant radius within one turn, and is fixed onto the dielectric window 52 by an antenna fixing member made of an insulating material.

An output terminal of a first high frequency power source 56 is electrically connected to one end of the RF antenna 54 through a matching box 58 and an electric supply line 60. The other end of the RF antenna 54 is electrically connected to a ground potential through an earth cable.

The first high frequency power source 56 may output a high frequency HF for generating plasma having a frequency (for example, 27 MHz or greater) suitable for generation of the plasma by high-frequency discharge at variable power (for example, 200 W to 1400 W). The matching box 58 accommodates a matching circuit of a variable reactance for matching between an impedance on a side of the first high frequency power source 56 and an impedance on a side of a load (mainly, an RF antenna, plasma, and a correction coil).

A gas supply unit for supplying a predetermined gas into a processing space inside the chamber 10 includes an annular manifold or a buffer 62 disposed inside (or outside) the sidewall of the chamber 10 at a position slightly lower than the dielectric window 52, a great number of sidewall gas discharge ports 64 facing a plasma generation space S from the buffer 62 at equal intervals in the circumferential direction, and a gas supply pipe 68 extending from a gas supply source 66 to the buffer 62. The gas supply source 66 includes a flow rate controller and on-off valve.

The control unit 74 includes, for example, a microcomputer and controls various portions of the inductively-coupled plasma processing apparatus 5. The various portions of the inductively-coupled plasma processing apparatus 5 are the evacuation device 26, a second high frequency power source 30, the first high frequency power source 56, the matching box 32, the matching box 58, the switch for the electrostatic chuck, the gas supply source 66, a chiller unit, and the heat transfer gas supplying unit.

The film deposition using this inductively-coupled plasma processing apparatus 5 is performed as follows. At first, the gate valve 28 is opened, the wafer W to be processed is carried into the chamber 10 and is mounted on the electrostatic chuck 36. After the gate valve 28 is closed, a predetermined gas is introduced into the chamber 10 from the gas supply source 66 through the gas supply pipe 68, the buffer 62, and the sidewall gas discharge port 64 into the chamber 10 at a predetermined flow rate and a predetermined flow ratio. The pressure inside the chamber 10 is set to be a set value by the evacuation device 26. Further, the first high frequency power source 56 is turned on to cause the high frequency HF for the plasma generation having predetermined RF power to be output to supply predetermined electric power of the high frequency HF to the RF antenna 54 through the matching box 58 and the electric supply line 60.

On the other hand, in a case where power of high frequency LF for an ion drawing-in control is applied, the second high frequency power source 30 is turned on to cause the high frequency power LF to be output and the power of the high frequency LF to be applied to the stage 12 through the matching box 32 and the feed rod 34. In a case where the high frequency for the ion drawing-in control is not applied, the high frequency power LF is set to be 0 W.

The electrostatic chuck 36 for holding the wafer W using electrostatic adsorption power is provided on the upper surface of the stage 12. A focus ring 38 annularly surrounding the periphery of the wafer W is disposed on an outer peripheral side of the electrostatic chuck 36. The electrostatic chuck 36 is formed by interposing an electrode 36a made of a conductive film between a pair of insulating films 36b and 36c. A high voltage direct power source 40 is electrically connected through a switch 42 and a coated wire 43 to the electrode 36a. The wafer W can be absorbed and held on the electrostatic chuck 36 by electrostatic force caused by a direct current supplied from the direct power source 40.

An refrigerant room or a refrigerant flow path 44 is formed inside the stage 12. The refrigerant room and the refrigerant flow path 44 are in an annular shape extending in a circumferential direction of the stage 12. A refrigerant having a predetermined temperature such as cooling water cw is circulated into and out of the chiller unit, and is supplied to pipes 46 and 48 from the chiller unit. It is possible to control the temperature of the wafer W on the electrostatic chuck 36 while the wafer W is processed depending on the temperature of the refrigerant. Related to this, a heat transfer gas from the heat transfer gas supply unit such as a He gas is supplied in between the upper surface of the electrostatic chuck 36 and the back surface of the wafer W through the gas supply pipe 50. Further, a lift pin vertically penetrating through the stage 12 and movable up and down to load and unload the wafer W, a lifting mechanism for activating the lift pin, and so on are disposed.

The predetermined gas discharged from the gas discharge ports 64 in the sidewall uniformly diffuses into the processing space below the dielectric window 52. An RF magnetic field is generated around the RF antenna 54 by an electric current of the high frequency HF flowing through the RF antenna 54. The magnetic field lines of this RF magnetic field penetrate the dielectric window 52 and passes through the plasma generation space S. A temporal change of the RF magnetic field causes a RF induction field to be generated in an azimuth angle direction of the processing space. Then, electrons accelerated in this azimuth angle direction by this RF induction field are subjected to ionizing collisions with molecules and atoms of the supplied gas so as to generate plasma in a doughnut shape. The radicals and ions of the plasma in the donuts-like shape are dispersed all around in a wide processing space. The radicals fall in an equal direction so as to be supplied onto the upper surface (the surface to be processed) of the wafer W. The ions are drawn by a DC bias so as to be supplied onto the upper surface (the surface to be processed) of the wafer W. Thus, active species of the plasma effect a chemical reaction and a physical reaction in the surface to be processed of the wafer W. Resultantly, the film to be processed is etched to have a predetermined pattern.

This inductively-coupled plasma processing apparatus 5 generates the plasma of the inductive coupling to be in the donuts-like shape under the dielectric window 52 close to the RF antenna 54. This plasma in the donuts-like shape is dispersed inside a wide processing space so as to equalize the density of the plasma in the vicinity of the stage 12 (namely, on the wafer W). Here, the density of the plasma in the donuts-like shape depends on the intensity of the induction field and further depends on the magnitude of the power of the high frequency HF (specifically, the electric current flowing through the RF antenna 54) supplied to the RF antenna 54. Said differently, as the power of the high frequency HF becomes high, the density of the plasma in the donuts-like shape becomes high. The density of the plasma in the vicinity of the stage 12 becomes totally high due to the diffusion of the plasma. Meanwhile, a mode that the plasma in the donuts-like shape diffuses all around (especially, in a radial direction) depends on the pressure inside the chamber 10. As the pressure becomes lower, the plasma gathers more in the center part of the chamber and a plasma density distribution near the stage 12 tends to increase in the center part. Further, the plasma density distribution inside the plasma in the donuts-like shape may change depending on the power of the high frequency HF supplied to the RF antenna 54, the flow rate of the process gas introduced inside the chamber, or the like.

The plasma in the donuts-like shape is not limited to an exact ring-like shape, in which the plasma rises only on an outer side without rising on an inner side in the radial direction (the center portion) of the chamber 10. In the plasma in the donuts-like shape, the cubic volume or the density of the plasma is greater on the outer side in the radial direction of the chamber 10 than on the inner side in the radial direction of the chamber 10. There may be a case where the plasma in the donuts-like shape is not generated depending on conditions such as the type of the gas used as the process gas and the value of the pressure inside the chamber 10.

The control unit 74 includes a CPU, a read only memory (ROM), and a random access memory (RAM) (not illustrated). A procedure set in a recipe stored in the RAM or the like is to control various portions of the inductively-coupled plasma processing apparatus 5 of this embodiment. Thus, the film deposition method of this embodiment can be controlled.

[Blockage of Mask/Tapered Recess Part]

As illustrated in (a) of FIG. 2, when a film 8 to be etched is etched using a pattern of a mask 9 formed on the film 8, a step (hereinafter, referred to as a "deposition step") of forming a protection film on the mask 9 during an etching step may be conducted to improve a selection ratio. Especially, an improvement of a mask selection ratio in etching for forming a recess part having a high A/R ratio is important.

Figure 2:
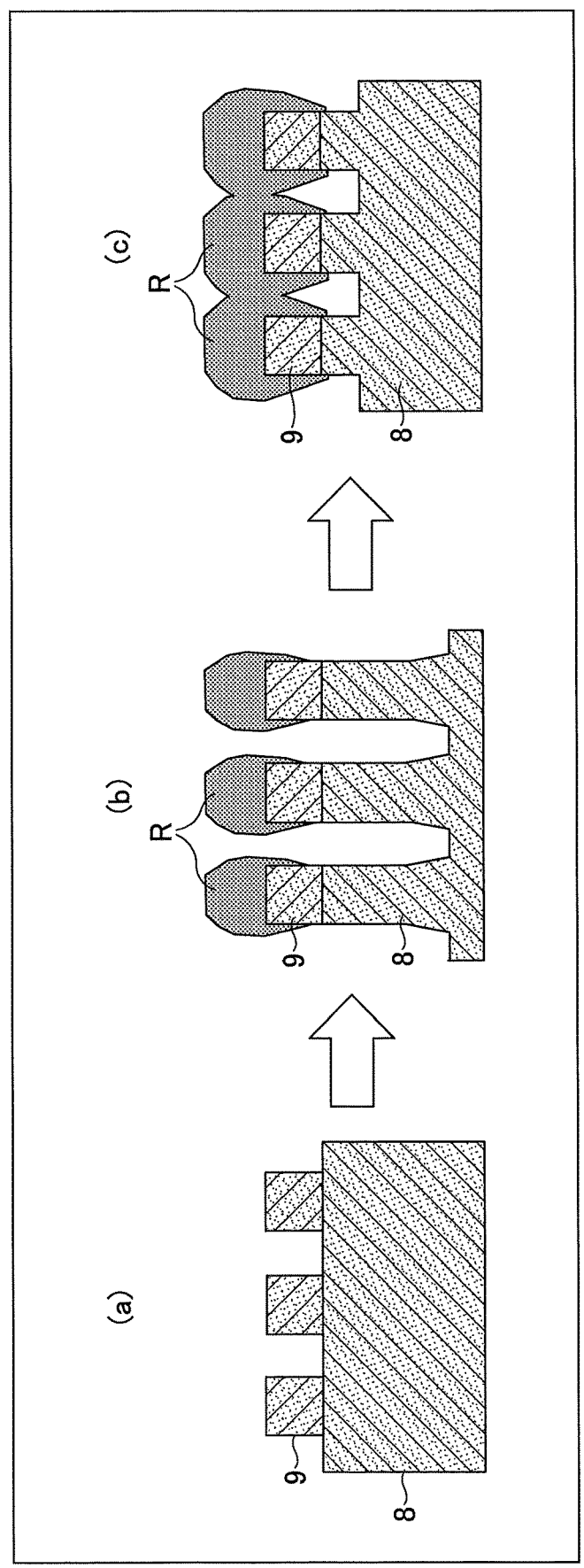
FIG. 2 illustrates an example of blockage of an opening of a mask according to the embodiment of the present invention.

In the deposition step, as illustrated in (b) and (c) of FIG. 2, a chemical compound (an organic film R) including an organic material is mainly deposited on the upper surface of the mask 9 and less deposited on side surfaces of the mask 9 so as to avoid blockage of the opening of the mask and a tapered recess part (the etching shape is not vertical) from being formed. Hereinafter, deposition of the organic film R, in which the upper surface of a predetermined film such as the mask 9 is thicker than the side surface of the predetermined film, is referred to as an "anisotropic deposition".

However, in an actual deposition step, the organic film R adheres along not only the vertical direction but also a lateral direction. Therefore, as illustrated in (c) of FIG. 2, the opening of the mask 9 is blocked by the organic film R to avoid etching.

Therefore, the film is anisotropically deposited on an upper part of the pattern of the recess part of the predetermined film in the inductively-coupled plasma processing apparatus 5 having the structure of this embodiment. Described next is a processing method of anisotropically depositing the organic film R on the predetermined film according to the embodiment.

[Sample]

FIGS. 3A to 3C illustrate sample examples of the object to be processed used to perform the processing method according to this embodiment. FIG. 3A illustrates a sample of (a) "SiN L&S", in which patterned lines and spaces (L&S) of an SiN film 1 are formed on the wafer W. The A/R ratio of the patterned recess part is not uniform (almost 3 to 5).

FIG. 3B illustrates a sample of (b) "High A/R", in which the SiN film 1 including a recess part having an aspect ratio (A/R ratio) of 18 is formed on the wafer W. FIG. 3C illustrates a sample of (c) "Organic L&S", in which a line and space (L&S) having an aspect ratio (A/R ratio) of 2 is formed. In the sample of "Organic L&S", a base film is an $SiO_2$ film 2. An organic film 3 and Si-Anti Reflective Coating (an antireflection film; Si-ARC) 4 are laminated on the base film.

The selection ratio of the mask is preferably increased in the etching. Therefore, the etching step and the step of depositing the organic film on the upper part of the mask are repeatedly conducted in the etching according to this embodiment.

A mask does not present in the pattern of the SiN film 1 of the sample. In this case, the upper part of the SiN film functions as the mask. Therefore, the organic film R having a high anisotropy may be deposited on the upper part of the SiN film 1 to prevent the opening of the SiN film 1 from being blocked. The above SiN film and Si-ARC 4 are samples as an example of the predetermined organic film R causing the organic film R to be deposited.

[Test: Measured Portion]

Figure 4B:
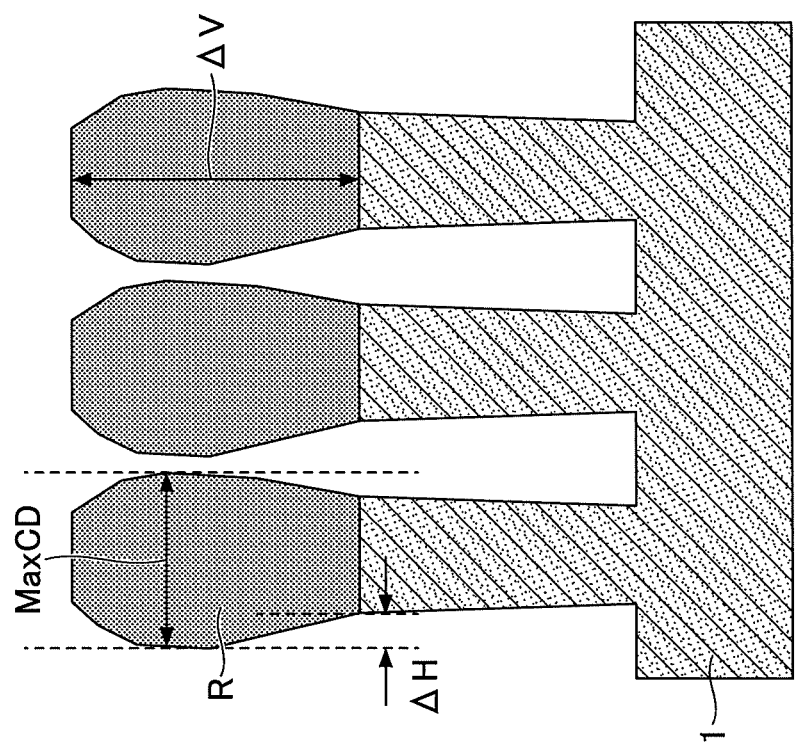
FIGS. 4A and 4B illustrate definition of measured portions of a deposited material according to the embodiment of the present invention.
Figure 4A:
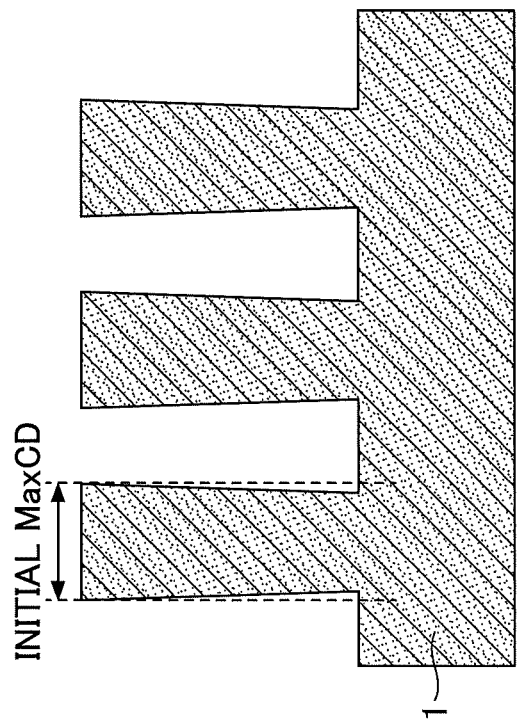

Hereinafter, an example of test results in the deposition step of depositing the organic film R is explained, and film deposition conditions preferable for deposition of the organic film R having a high anisotropy is considered. Referring to FIGS. 4A and 4B, measured portions of various films are defined. FIG. 4A illustrates an initial state of the SiN film 1. A recess part is formed in the SiN film 1. The width of the SiN film in the lateral direction in between the recess parts is referred to as a critical dimension (CD). The maximum value of CD in the initial state is defined as a "initial MaxCD".

FIG. 4B illustrates a state in which the organic film R is deposited on the upper part of the pattern of the SiN film 1 by the deposition step. The width in the lateral direction of the film including the organic film R formed on the upper part of the SiN film 1 is defined as the "MaxCD". ΔH is a variable calculated using the following formula.

$$\Delta H = (MaxCD - \text{Initial MaxCD})/2$$

Further, the height of the organic film R formed on the upper part of the SiN film 1 is defined as ΔV (Top Depo High).

Said differently, ΔV represents the height from the upper surface of the SiN film 1 to the top of the organic film R.

[Test 1: Gas Dilution Degree]

Referring to FIG. 5, a result of the test 1 of testing the gas dilution degree in the deposition step according to this embodiment is explained. A film deposition condition 1 of the test 1 is as follows.

<Deposition Condition 1>
Pressure: 100 mT (13.33 Pa)
Gaseous Species: $C_4F_6$/Ar
Dilution Degree: 0.4%, 0.6%, 1%
(The dilution degree represents the ratio of the flow rate of $C_4F_6$ gas relative to the Ar gas).
Stage Temperature: −50° C.
Film Deposition Time: 600 sec, 300 sec
Power of High Frequency HF: 300 W
Power of High Frequency LF: 0 W As a result of the test 1, in any one of the samples "SiN L&S", "High A/R", and "Organic L&S", and in case of any one dilution degrees of 0.4%, 0.6%, and 1%, an organic film R having a thickness ΔV is laminated on the upper part of the SiN film and the upper part of the Si-ARC 4. The opening of the recess part formed in the SiN film and S-ARC is not blocked. The value indicated by MaxCD/ΔV is smaller than 1 in all dilution degree of 0.4%, 0.6%, and 1%. Said differently, in the deposition condition 1, anisotropic deposition is performed such that the upper surface of the SiN film 1 and the upper part of the Si-ARC 4 respectively thicker than the side surface of the SiN film 1 and the side surface of the Si-ARC 4.

Figure 6A:
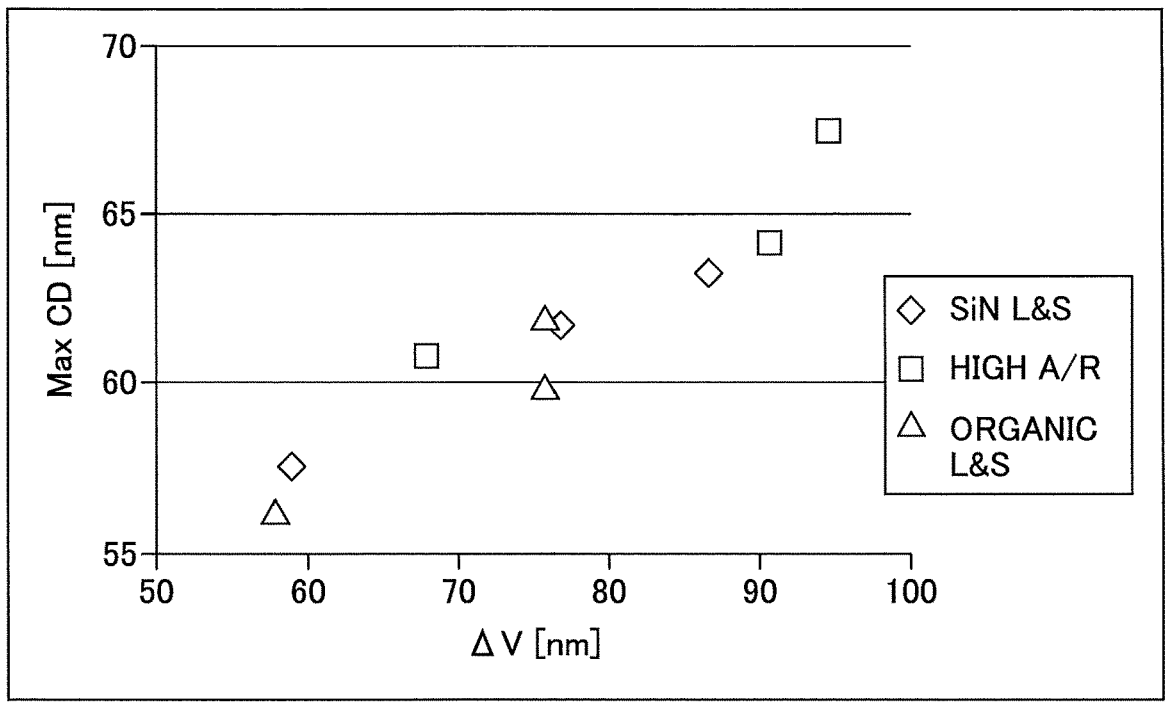
FIGS. 6A and 6B are graphs indicative of experiment results illustrated in FIG. 5.
Figure 6B:
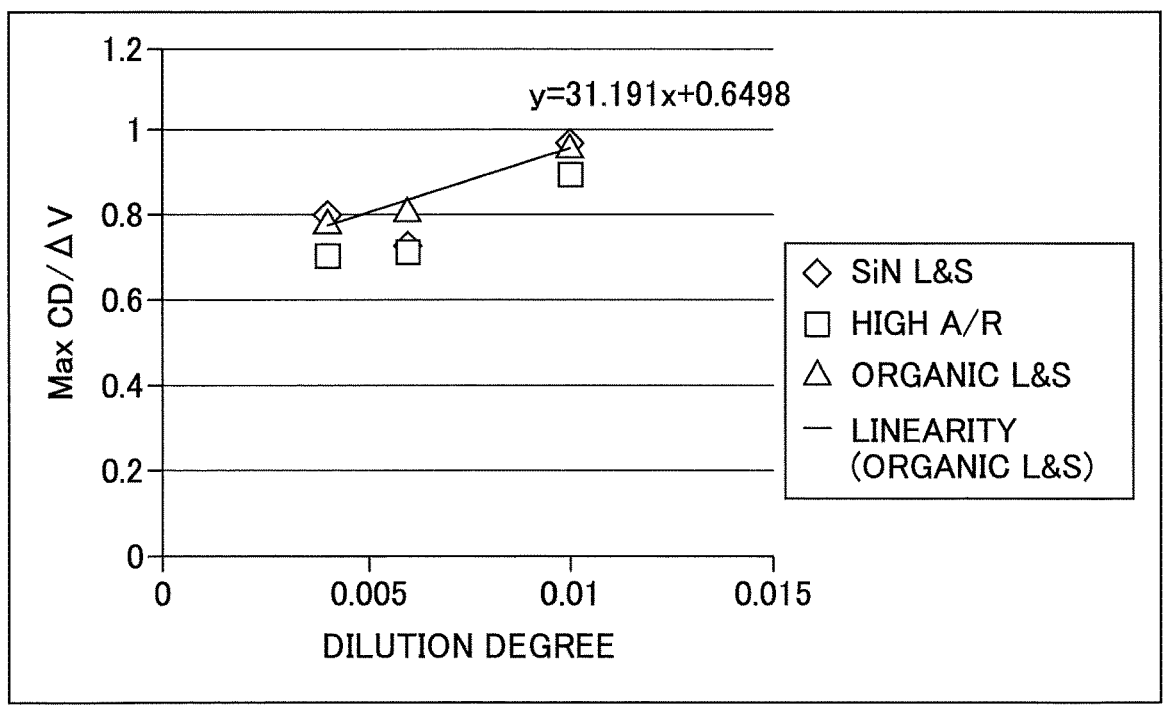

FIGS. 6A and 6B are graphs of the results of the test 1. Referring to FIG. 6A, there is a linearity between ΔV of the horizontal axis and MaxCD of the vertical axis. Said differently, as the deposition of the organic film R increases in the vertical direction, the deposition of the organic film R increases in the horizontal direction so as to widen. Referring to FIG. 6B, a relation between the degree of anisotropy of the film and the dilution degree is indicated. According to the graph, the value indicated by MaxCD/ΔV along the vertical axis is smaller than 1 in all the dilution degrees of all the samples. Therefore, it is known that the anisotropic deposition is performed so that the deposition of the film in the vertical direction is greater than the deposition of the film in the horizontal direction in all the dilution degrees in all the samples. Further, as the dilution degree is smaller, the resulted range of MaxCD/ΔV tends to become narrower. Thus, the anisotropy in the deposition of the organic film R becomes more conspicuous. However, the minimum value of MaxCD/ΔV is 0.705, which indicates that the shape of the side surface of the deposited organic film R is not vertical.

[Test 2: Gas Dilution Degree]

Referring to FIG. 7, the result of the test 1 of further increasing the gas dilution degree in the deposition step according to this embodiment is explained. In this test, "SiN L&S" is used as a sample. A deposition condition 2 of the test 2 is as follows.

<Deposition Condition 2>
Pressure: 100 mT (13.33 Pa)
Gaseous Species: $C_4F_6$/Ar
Dilution Degree: 1%, 10%, 50
Stage Temperature: −50° C.
Film Deposition Time: 300 sec, 30 sec, 20 sec
Power of High Frequency HF: 300 W
Power of High Frequency LF: 0 W According to the result of the test 2, in a case where the dilution degree is 1%, an organic film R having a height ΔV is laminated on the upper surface of the SiN film 1. Further, the opening of the SiN film 1 is not blocked, and a value indicated by MacCD/ΔV is smaller than 1. Said differently, in the deposition condition 2, in a case where the dilution degree is 1%, it is known that the anisotropic deposition is performed.

On the other hand, in a case where the dilution degree is 10% and 50%, the width of the SiN film 1 is blocked. Said differently, in the deposition condition 2, in the case where the dilution degree is 10% or 50%, the deposition of the film in the vertical direction and the deposition of the film in the horizontal direction are substantially the same or the deposition of the film in the horizontal direction is greater than the deposition of the film in the vertical direction (isotropic deposition).

As described above, in a case where the gas supplied in the deposition step is an Ar gas and a $C_4F_6$ gas, it is necessary that the ratio (the dilution degree) of the $C_4F_6$ gas relative to the Ar gas is 1% or smaller.

[Test 3: Temperature Dependence]

Figure 8:
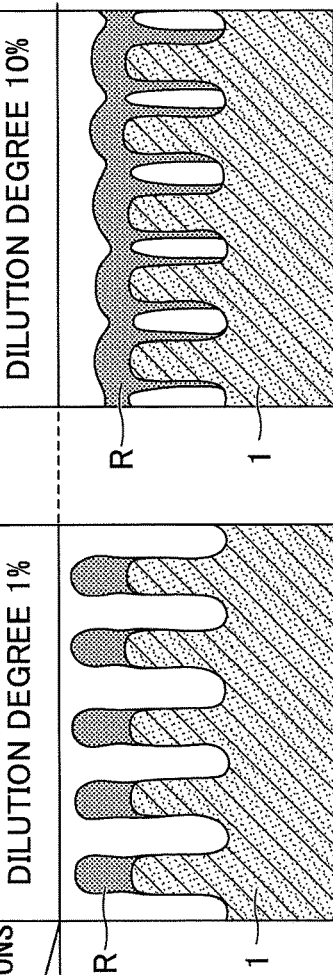
FIG. 8 illustrates examples of test results of temperature dependence in the deposition step according to the embodiment of the present invention.

Next, referring to FIG. 8, the temperature dependence in the deposition step of this embodiment is explained. A deposition condition 3 is the same as the deposition condition 2 except for the stage temperature. The stage temperature is to set the stage temperature to be 20° C., which is different from the deposition condition 2 of setting the stage temperature to be −50° C. In this test 3, "SiN L&S" is used as a sample. Further, the result in the case where the dilution degree is 50% was not obtainable in this test 3.

According to the result of the test 3, in the case where the dilution degree is 1%, the opening of the SiN film 1 is not blocked and the value indicated by MaxCD/ΔV is smaller than 1. Said differently, in the deposition condition 3, in a case where the dilution degree is 1%, it is known that the anisotropic deposition is performed.

On the other hand, in a case where the dilution degree is 10%, the opening of the SiN film 1 is blocked. The value indicated by MaxCD/ΔV is ∞. Said differently, in the deposition condition 3, in a case where the dilution degree is 10%, it is known that the isotropic deposition is performed.

As described above, in a case where the gas supplied in the deposition step is the Ar gas or the $C_4F_6$ gas, as long as the ratio (the dilution degree) of the $C_4F_6$ gas relative to the Ar gas is 1% or smaller, the condition for the stage temperature is not indispensable.

[Test 4: Pressure Dependence]

Next, referring to FIG. 9, the pressure dependence in the deposition step of this embodiment is explained. In this test 4, "Organic L&S" is used as a sample. A deposition condition 4 of the test 4 is as follows.

<Deposition Condition 4>
Chamber Internal Pressure: 10 mT (1.33 Pa), 100 mT, 500 mT (66.5 Pa)
Gaseous Species: $C_4F_6$/Ar
Dilution Degree: 1%, 0.4%
Stage Temperature: −50° C.
Film Deposition Time: 180 sec, 300 sec, 600 sec
Power of High Frequency HF: 300 W
Power of High Frequency LF: 0 W According to the result of the test 4, in a case where the dilution degree is 1% and the pressure is 10 mT, the value of MaxCD/ΔV is greater than 1. In a case where the dilution degree is 100 mT, the value of MaxCD/ΔV is smaller than 1. Further, in the case where the dilution degree is 0.4%, in the pressure 100 mT and 500 mT, the value of MaxCD/ΔV is smaller than 1. As described above, in the case where the dilution degree is 1% or smaller, when the pressure inside the chamber is set to be 100 mT or higher, it is known that the anisotropical etching is performed. Further, as the pressure is higher, the anisotropical etching is more easily performed.

[Test 5: Diluent gas Dependence]

Figure 10:
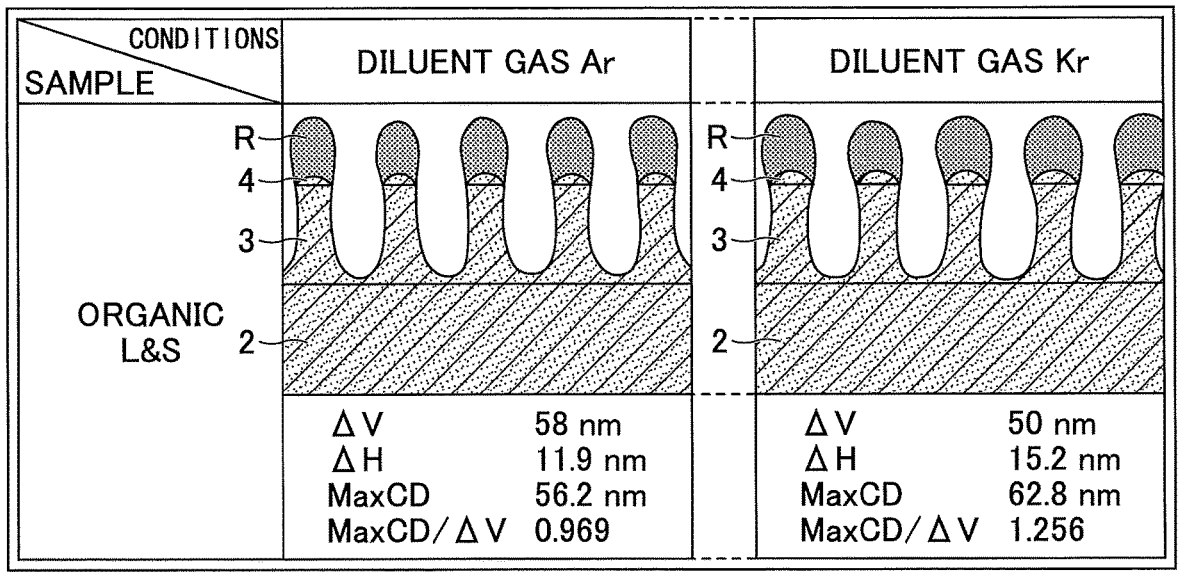
FIG. 10 illustrates examples of test results of diluent gas dependence in the deposition step according to the embodiment of the present invention.

Next, referring to FIG. 10, diluent gas dependence in the deposition step of this embodiment is explained. In this test 5, "Organic L&S" is used as a sample. A deposition condition 5 of the test 5 is as follows.

<Deposition Condition 5>
Chamber Internal Pressure: 100 mT
Gaseous Species: $C_4F_6$/Ar, $C_4F_6$/Kr
Dilution Degree: 1%
Stage Temperature: −50° C.
Film Deposition Time: 300 sec
Power of High Frequency HF: 300 W
Power of High Frequency LF: 0 W According to the result of the test 5, in a case where an Ar gas is used as a diluent gas, the value of MaxCD/ΔV is smaller than 1. Meanwhile, in a case where a Kr gas is used as the diluent gas, the value of MaxCD/ΔV is greater than 1. As described above, it is preferable to use the Ar gas as the diluent gas for diluting the $C_4F_6$ gas.

[Test 6: LF Dependence]

Figure 11:
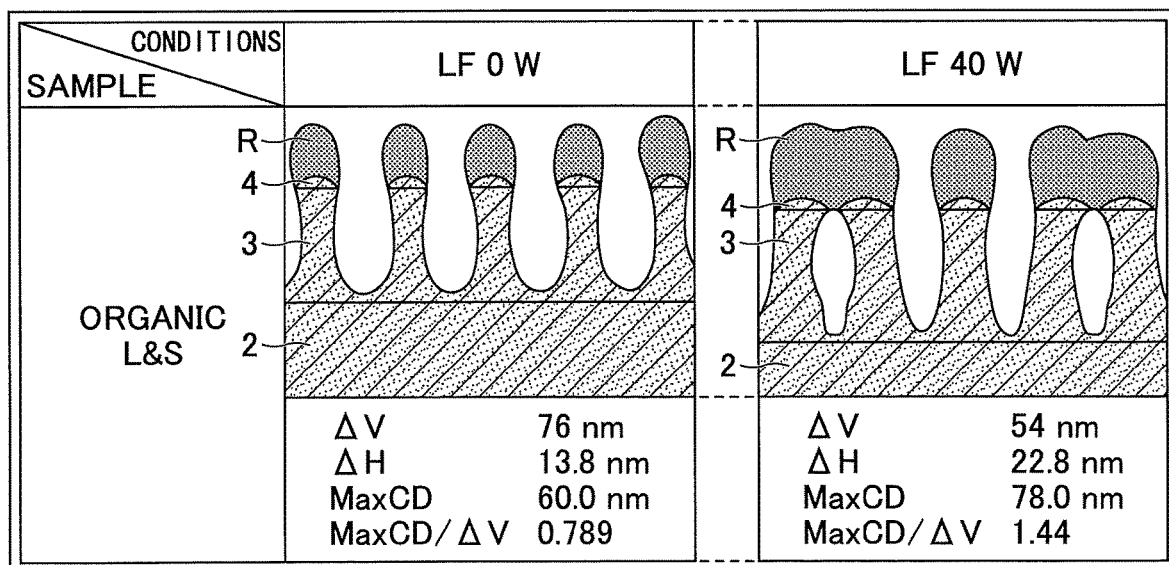
FIG. 11 illustrates examples of test results of LF dependence in the deposition step according to the embodiment of the present invention.

Next, referring to FIG. 11, LF dependence in the deposition step of this embodiment is explained. In this test 6, "Organic L&S" is used as a sample. A deposition condition 6 of the test 6 is as follows.

<Deposition Condition 6>
Chamber Internal Pressure: 100 mT
Gaseous Species: $C_4F_6$/Ar
Dilution Degree: 0.4%
Stage Temperature: −50° C.
Film Deposition Time: 600 sec
Power of High Frequency HF: 300 W
Power of High Frequency LF: 0 W, 40 W According to the result of the test 6, in a case where the power of high frequency LF is not applied, the value of MaxCD/ΔV is smaller than 1, and, in a case where the power of high frequency LF having 40 W is applied, the value of MaxCD/ΔV is greater than 1. Therefore, it is preferable not to apply the power of high frequency LF. This is because when a function of ions in the plasma generated from the $C_4F_6$ gas and the Ar gas increases, the organic film R tends to be isotropically deposited.

[General Overview]

Figure 13A:
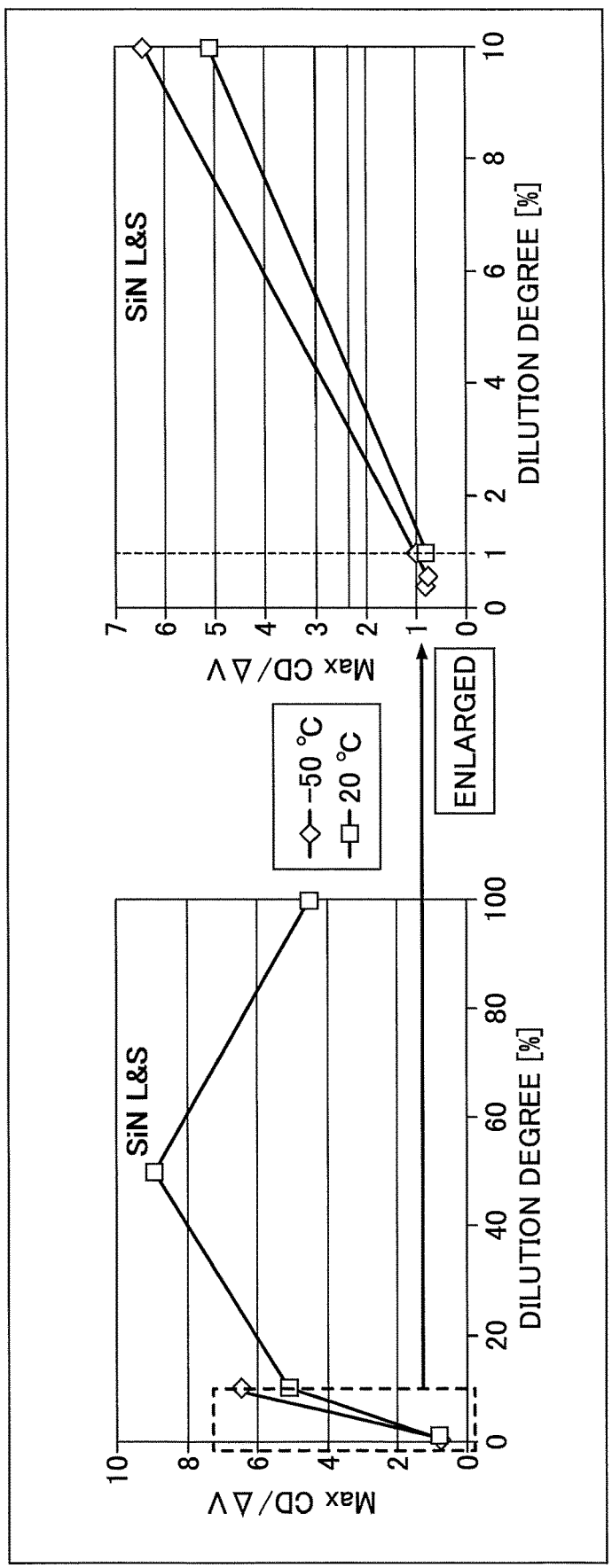
FIGS. 13A and 13B are graphs of various parameter dependence in the deposition step according to the embodiment of the present invention.
Figure 13B:
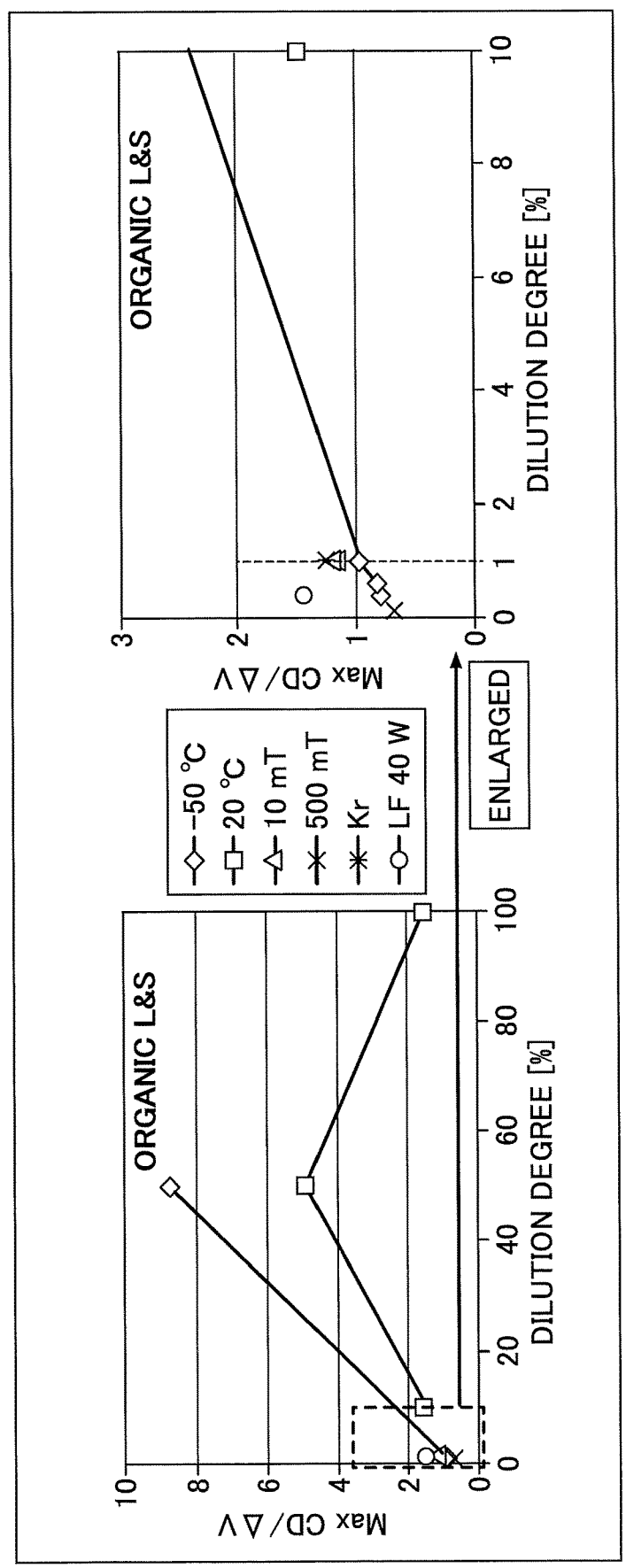
Figure 14:
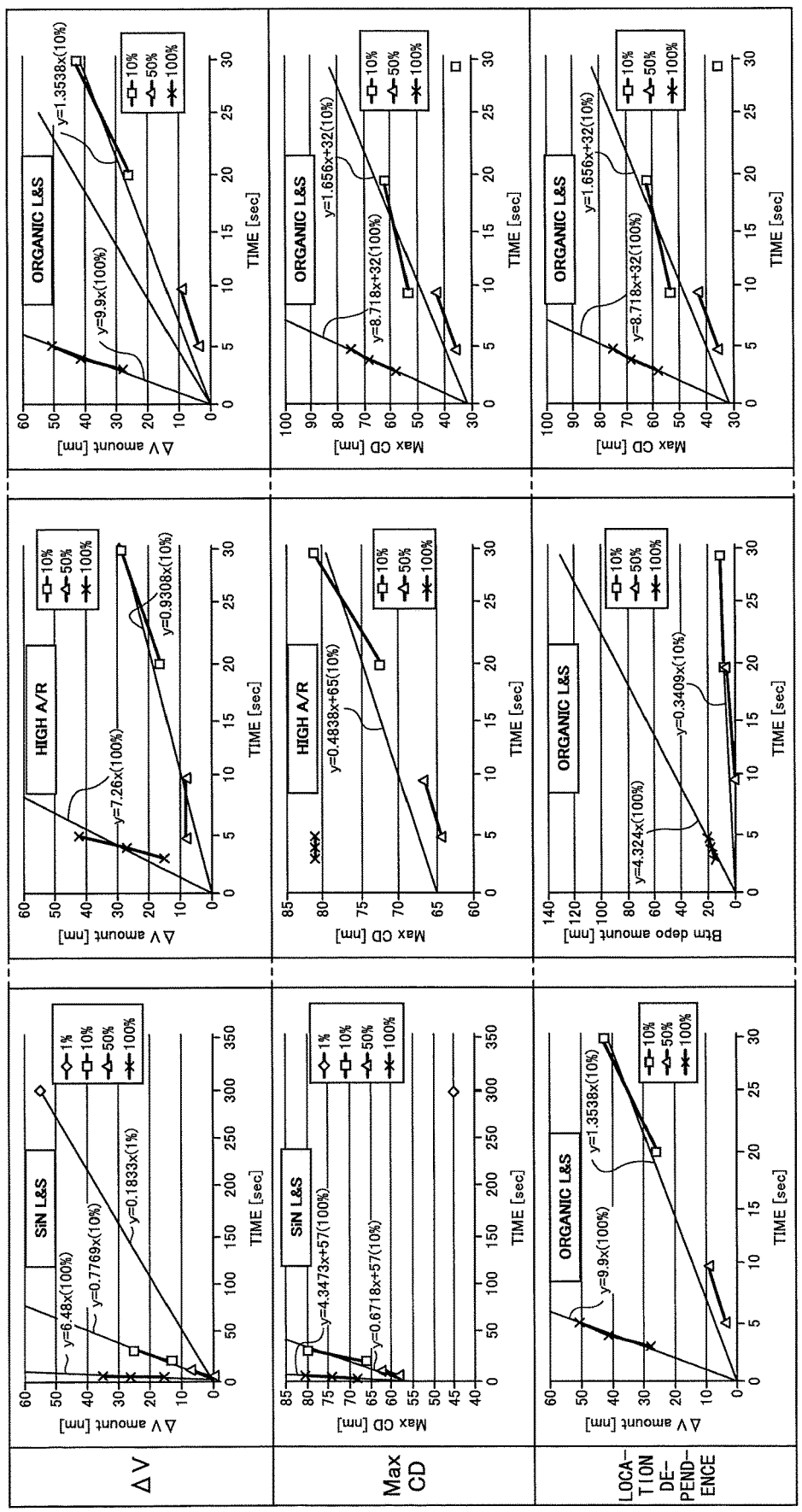
FIG. 14 illustrates graphs of test results in the deposition step according to the embodiment of the present invention.

Referring to FIGS. 12 to 14, the general overview of the test results obtained by conducting the deposition step of this embodiment is explained. FIG. 12 illustrates the test results of the dilution degree in the deposition step of the embodiment.

The upper row of FIG. 12 illustrates measured results of the deposited organic film with respect to the dilution degrees in a case where the stage temperature is set to be −50° C. in conducting the deposition step. The lower row of FIG. 12 illustrates measured results of the deposited organic film with respect to the dilution degrees in a case where the stage temperature is set to be 20° C. in conducting the deposition step. According to FIG. 12, regardless of the stage temperatures of −50° C. and 20° C., as long as the dilution degree is 1% or smaller, the value of MaxCD/ΔV becomes smaller than 1 to perform the anisotropical deposition of the organic film R.

FIGS. 13A and 13B illustrate various parameter dependence in conducting the deposition step of this embodiment. FIG. 13A is a graph indicating a relation of the dilution degree in a case where the sample is "SiN L&S" and the result of MaxCD/ΔV of the deposited organic film. FIG. 13B is a graph indicating a relation of the dilution degree in a case where the sample is "Organic L&S" and the result of MaxCD/ΔV of the deposited organic film. In FIGS. 13A and 13B, areas surrounded by broken lines where the dilution degree is 10% or less are enlarged on the right sides, respectively.

According to this, both in the cases where the samples are "SiN L&S" and "Organic L&S", MaxCD/ΔV becomes smaller than 1 when the dilution degree is 1% or smaller to cause the organic film R to be anisotropically deposited. With this, it is possible to etch the film to be etched having at least two A/R ratios by improving a selection ratio using the organic film R while preventing the mask from blocking in the upper part of the recess part.

The enlarged view in FIG. 13B indicates that MaxCD/ΔV may become 1 or greater even in a case where the dilution degree is 1% or smaller. Specifically, in a case where a Kr gas is used as the diluent gas, the high frequency LF, and the pressure inside the chamber is 10 mT or lower, the organic film R can be isotropically deposited. Therefore, it is preferable to use the Ar gas as the diluent gas. Further, it is preferable not to apply the high frequency LF. Further, it is preferable to make the pressure inside the chamber 100 mT or higher. Thus, the organic film R may be anisotropically deposited.

FIG. 14 includes graphs indicating test results of the deposition step for each sample at 20° C. according to this embodiment. The upper row of FIG. 14 indicates an accumulated value of ΔV relative to the time. The middle row of FIG. 14 indicates MaxCD relative to the time. The lower row of FIG. 14 indicates location dependence of the deposited amount of the organic film relative to the time.

According to this, as in the upper and middle rows of FIG. 14, the gradient of x in a function y designates a deposition speed. In every sample, if a ratio of the $C_4F_6$ gas relative to the Ar gas is increased (said differently, as the dilution degree becomes higher), a deposition speed (ΔV amount) of the organic film R in the vertical direction and a deposition speed (MaxCD) of the organic film R in the horizontal direction become higher.

As in the lower row of FIG. 14, it is known that a deposition speed changes depending on a deposition speed (ΔV) of the organic film R in the vertical direction, a deposition speed (Btm depo amount) in the bottom part of the organic film R, and the deposition speed (MaxCD) of the organic film R in the horizontal direction. Said differently, the deposition speed changes depending on a location where the organic film R is deposited.

[Etching Process]

Figure 15:
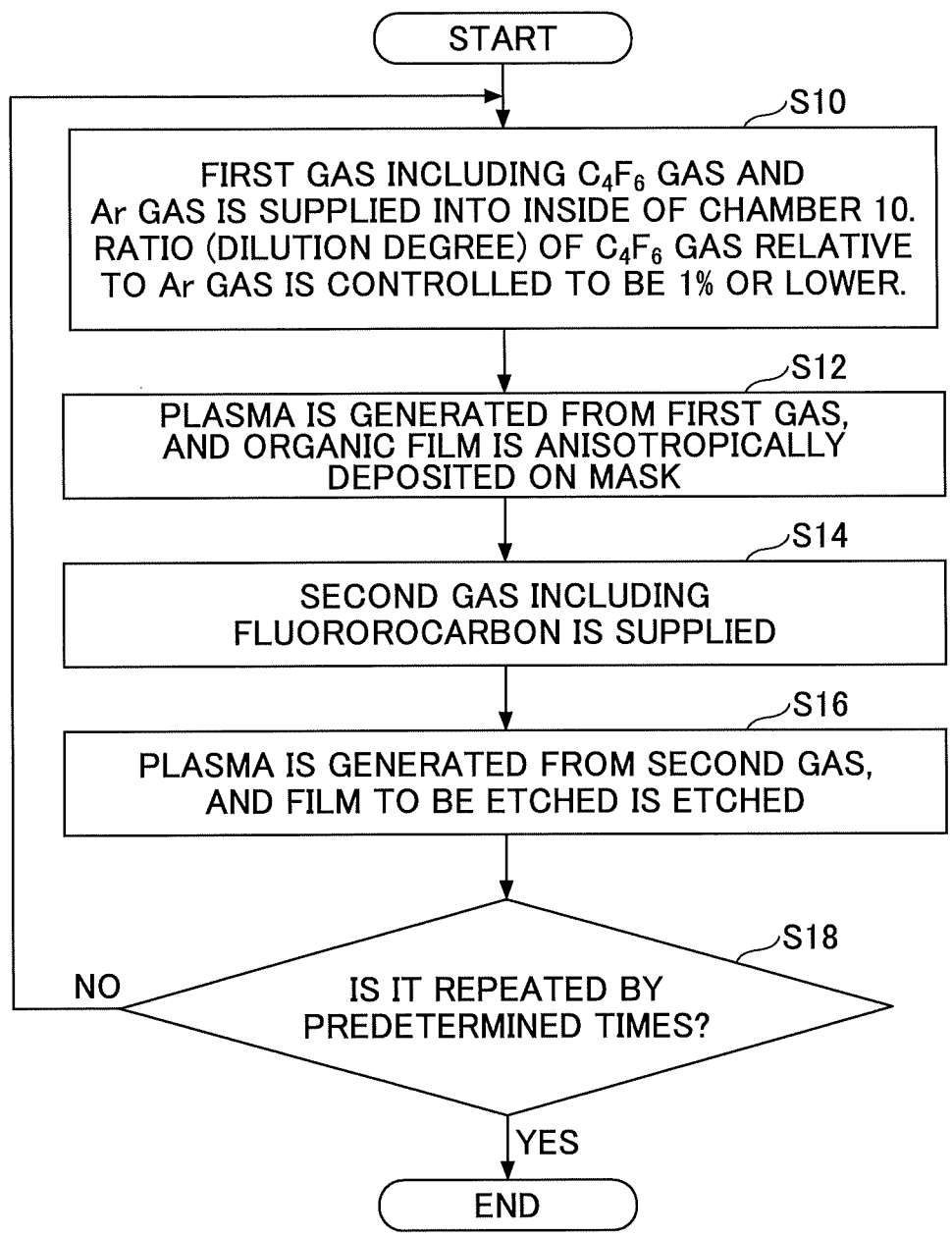
FIG. 15 is a flowchart illustrating an example of an etching process of the embodiment of the present invention.

Referring to FIG. 15, the etching process of this embodiment including the above deposition step is explained. FIG. 15 is a flowchart illustrating an example of the etching process of the embodiment of the present invention. In the etching process of the embodiment, the film to be etched is etched while the organic film is anisotropically deposited on the mask. An example of the film to be etched is an SiN film or an $SiO_2$ film.

Hereinafter, an upper part of the SiN film or the $SiO_2$ film functions as a mask. The above SiN film and Si-ARC 4 functioning as the mask are examples of a predetermined film causing the organic film R to be deposited on it. This process is controlled by the control unit 74 illustrated in FIG. 1.

After the process of FIG. 15 is started, the control unit 74 supplies a first gas including a $C_4F_6$ gas and an Ar gas into an inside of the chamber (step S10; a first step). At this time, the control unit 74 controls a ratio (i.e., a dilution degree) of the $C_4F_6$ gas relative to the Ar gas so as to be 1% or smaller (step S10). The control unit 74 controls to apply power of high frequency HF for generating plasma to the electrode and not to apply power of high frequency LF for pulling in the bias to the electrode (step S10).

Next, the control unit 74 generates plasma from the first gas and causes the organic film to be anisotropically deposited (step S12; a second process). In the second step, it is possible to deposit the organic film so that the upper surface of the predetermined film becomes thicker than the side surface of the predetermined film. For example, the organic film can be deposited so that an increase of the CD dimension of the SiN film and the $SiO_2$ film in the horizontal direction caused by the deposition of the organic film is greater than an increase of the CD dimension of the SiN film and the $SiO_2$ film in the vertical direction caused by the deposition of the organic film.

Next, the control unit 74 supplies the second gas including a fluorocarbon gas into an inside of the chamber 10 (step S14: a third step). At this time, the control unit 74 may apply the high frequency LF for pulling in the bias along with an application of the high frequency HF for generating the plasma.

Next, the control unit 74 generates the plasma from the supplied second gas and the film to be etched is etched (step S16: a fourth step). Next, the control unit 74 determines whether the above steps are repeated by a predetermined number of times (step S18). After the steps S10, S12, S14, and S18 are repeated by the predetermined number of times, this process ends.

According to this process, the organic film is anisotropically deposited on the upper part of the pattern of the recess part of the mask. Therefore, the mask selection ratio is improved and the blockage of the opening of the recess part is prevented to conduct the etching. Within this embodiment, the deposition process of the organic film and the etching process are repeated by a predetermined times. However, the embodiment may not be limited to this, and the deposition process and the etching process may be conducted only once.

The first gas may be a gas including the carbon-containing gas and the inert gas. The carbon-containing gas may be any one of a fluorocarbon gas, a hydrocarbon gas, a hydrofluorocarbon gas, and alcohol. More specifically, the carbon-containing gas may be any one of $C_4F_6$, $C_5F_8$, $C_4F_8$, and IPA($C_3H_8O$). IPA is one kind of secondary alcohol. The second gas may include a $C_4F_6$ gas, an Ar gas, and an $O_2$ gas.

[Other Plasma Processing Apparatuses]

The etching process of this embodiment is not limited to the ICP apparatus illustrated in FIG. 1. For example, the etching process of this embodiment may be conducted by a capacitive coupled plasma (CCP) apparatus with two frequencies from an upper part and a lower part illustrated in FIG. 16. The capacitive coupled plasma (CCP) apparatus with two frequencies from the upper part and the lower part is an example of a capacitively-coupled plasma processing apparatus, which applies the power of high frequency HF for generating the plasma onto a side of the upper part electrode.

Figure 16:
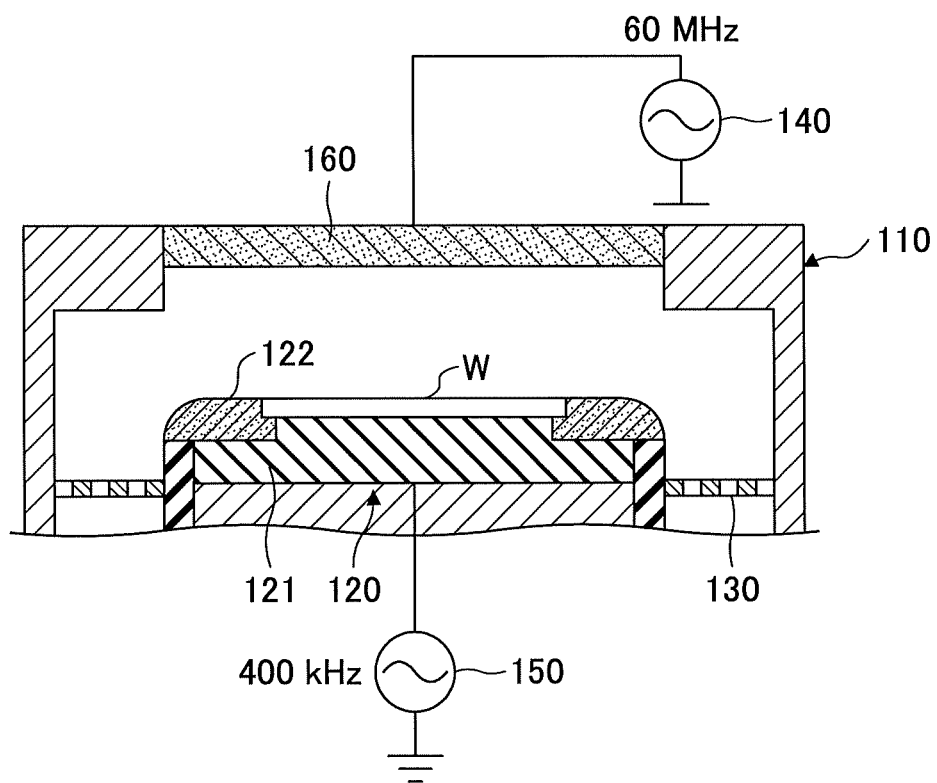
FIG. 16 illustrates a schematic structure of another plasma processing apparatus according to the embodiment of the present invention.

As illustrated in FIG. 16, in the capacitive coupled plasma (CCP) apparatus with two frequencies from the upper part and the lower part, a stage 120 is provided inside the chamber 110. An electrostatic chuck 121 for holding a wafer W is provided on the upper surface of the stage 120. A focus ring 122 annularly surrounding the periphery of the wafer W is disposed on an outer peripheral side of the electrostatic chuck 121.

An annular evacuation path is formed between an inner wall of the chamber 10 and a side wall of the stage 120. An annular baffle plate 130 is attached to an upper part or an inlet of the annular evacuation path. A second high frequency power source 150 is connected to the stage 120. The second high frequency power source 150 applies power of a high frequency LF for pulling in the bias of, for example, 400 MHz. However, in the etching process of the embodiment, the power of the high frequency LF for pulling in the bias is not applied.

A ceiling of the chamber 110 opposite to the stage 120 functions as an upper electrode 160. The first high frequency power source 140 is connected to the upper electrode 160. The first high frequency power source 140 applies power of a high frequency HF for generating plasma of, for example, 60 MHz.

By using the plasma processing apparatus, the organic film can be anisotropically deposited on the upper part of the pattern of the recess part formed on the wafer W. The plasma processing apparatus conducting the etching process of this embodiment is any one of a microwave plasma processing apparatus and a remote plasma apparatus.

For example, the wafer W is mentioned in this specification as an example. However, the object to be processed is not limited to the above and may be various boards used for a liquid crystal display (LCD) or a flat panel display (FPD), a photomask, a CD substrate, or a printed wiring board.

According to an aspect, the organic film can be anisotropically deposited on the upper part of the pattern of the recess part formed in the object to be processed.

All examples and conditional language recited herein are intended for pedagogical purposes to aid the reader in understanding the invention embodiments and the concepts contributed by the inventor to furthering the art, and are to be construed as being without limitation to such specifically recited examples and conditions, nor does the organization of such examples in the specification relate to a showing of superiority or inferiority of the invention embodiments. Although the processing method of the present invention has been described in detail, it should be understood that the various changes, substitutions, and alterations could be made hereto without departing from the spirit and scope of the invention.

What is claimed is:

1. A processing method comprising:
    a first step of supplying a first gas including a carbon-containing gas and an inert gas into an inside of a chamber; and
    a second step of generating plasma from the supplied first gas by applying radio frequency power for generating plasma and causing a chemical compound including organic matter on a pattern of a predetermined film formed on an object to be processed, the second step causing the chemical compound including the organic matter only on an upper surface of the predetermined film formed on an object to be anisotropically deposited,
    wherein a ratio of the carbon-containing gas relative to the inert gas included in the first gas is 1% or less.

2. The processing method according to claim 1, the processing method further comprising:
    a third step of supplying a second gas including a fluorocarbon gas into the inside of the chamber; and
    a fourth step of generating the plasma from the supplied second gas to etch a film below the predetermined film.

3. The processing method according to claim 2,
    wherein both the second step and the third step are repeatedly conducted by a predetermined number of times.

4. The processing method according to claim 1,
    wherein the carbon-containing gas is any one of a fluorocarbon gas, a hydrocarbon gas, a hydrofluorocarbon gas, and alcohol.

5. The processing method according to claim 4,
    wherein the carbon-containing gas is any one of $C_4F_6$, $C_5F_8$, $C_4F_8$, and IPA ($C_3H_8O$).

6. The processing method according to claim 1, wherein the inert gas is Ar.

7. The processing method according to claim 1,
    wherein radio frequency power for generating plasma is applied to an upper part electrode disposed at a ceiling of the chamber.

8. The processing method according to claim 1,
    wherein radio frequency power for pulling in bias is not applied to the chamber.

9. The processing method according to claim 1,
    wherein the processing method is conducted by any one of an inductively-coupled plasma processing apparatus, a capacitively-coupled plasma processing apparatus of applying the radio frequency power for generating the plasma is applied on a side of the upper electrode, a microwave plasma processing apparatus, and a remote plasma.

* * * * *